(12) United States Patent
Fowler et al.

(10) Patent No.: US 8,130,294 B2
(45) Date of Patent: Mar. 6, 2012

(54) IMAGING ARRAY WITH NON-LINEAR LIGHT RESPONSE

(75) Inventors: Boyd Fowler, Sunnyvale, CA (US); Xinqiao Liu, Mountain View, CA (US)

(73) Assignee: BAE Systems Imaging Solutions, Inc., Milpitas, CA (US)

( * ) Notice: Subject to any disclaimer, the term of this patent is extended or adjusted under 35 U.S.C. 154(b) by 481 days.

(21) Appl. No.: 12/330,294

(22) Filed: Dec. 8, 2008

(65) Prior Publication Data

US 2010/0141819 A1 Jun. 10, 2010

(51) Int. Cl.
*H04N 3/14* (2006.01)
*H04N 5/335* (2006.01)
(52) U.S. Cl. ......... 348/294; 348/299
(58) Field of Classification Search ......... 348/294, 348/299
See application file for complete search history.

(56) References Cited

U.S. PATENT DOCUMENTS

| | | | | |
|---|---|---|---|---|
| 4,809,073 A | * | 2/1989 | Chiba et al. | 348/314 |
| 5,043,571 A | * | 8/1991 | Hasegawa | 250/226 |
| 6,646,683 B1 | * | 11/2003 | Mandle | 348/299 |
| 6,833,871 B1 | * | 12/2004 | Merrill et al. | 348/302 |
| 7,541,571 B2 | * | 6/2009 | Lee | 250/214.1 |
| 2006/0038207 A1 | * | 2/2006 | Hong et al. | 257/292 |

* cited by examiner

*Primary Examiner* — James Hannett
(74) *Attorney, Agent, or Firm* — Calvin B. Ward

(57) ABSTRACT

An imaging array and method for capturing an image utilizing the same are disclosed. The imaging array includes an array of pixel sensors in which each pixel includes a dual-ported photodiode or photogate and a charge conversion circuit. The charge conversion circuit generates a voltage signal that is a function of a charge on the dual-ported photodiode. The controller applies a potential that varies over the exposure to the second gates in the dual-ported photodiodes, each second port passing charge stored in the photodiode connected to the second port when a potential in the photodiode exceeds the applied potential. The potential is chosen such that charge flows through the second gates of pixel sensors that are exposed to light intensities greater than a first threshold intensity during the exposure.

17 Claims, 9 Drawing Sheets

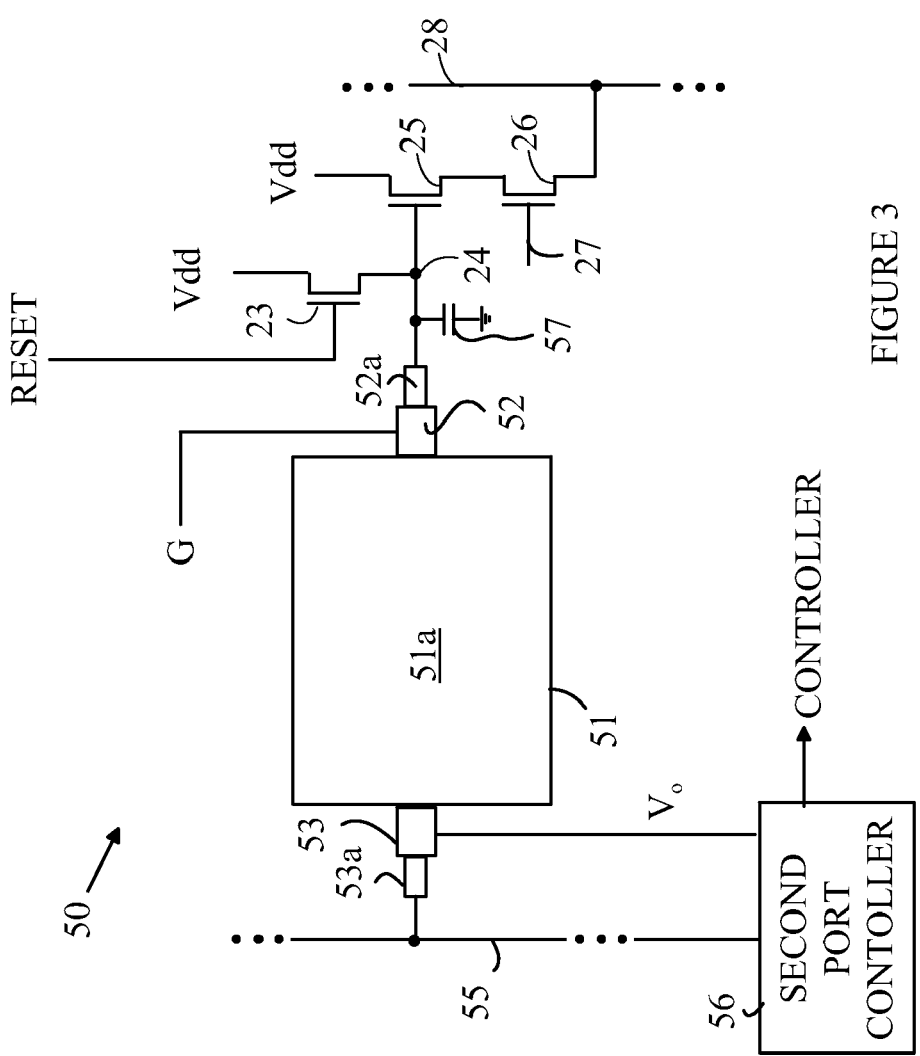
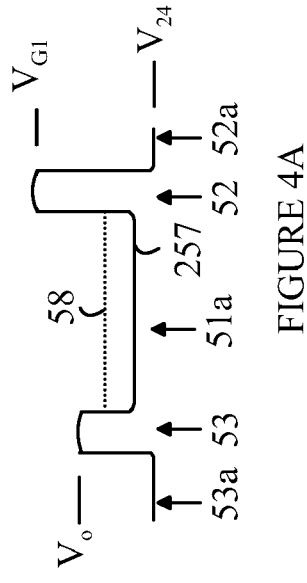
FIGURE 4A
FIGURE 4B
FIGURE 3

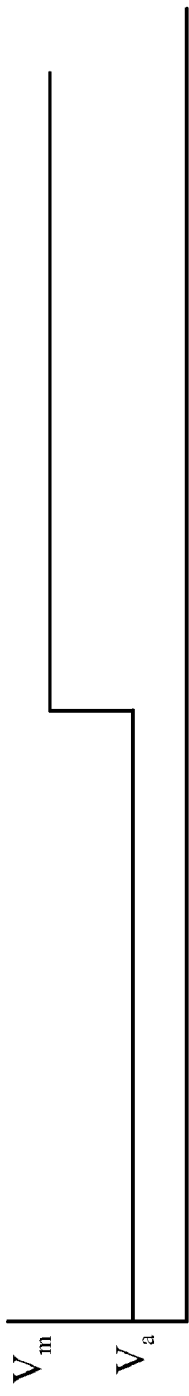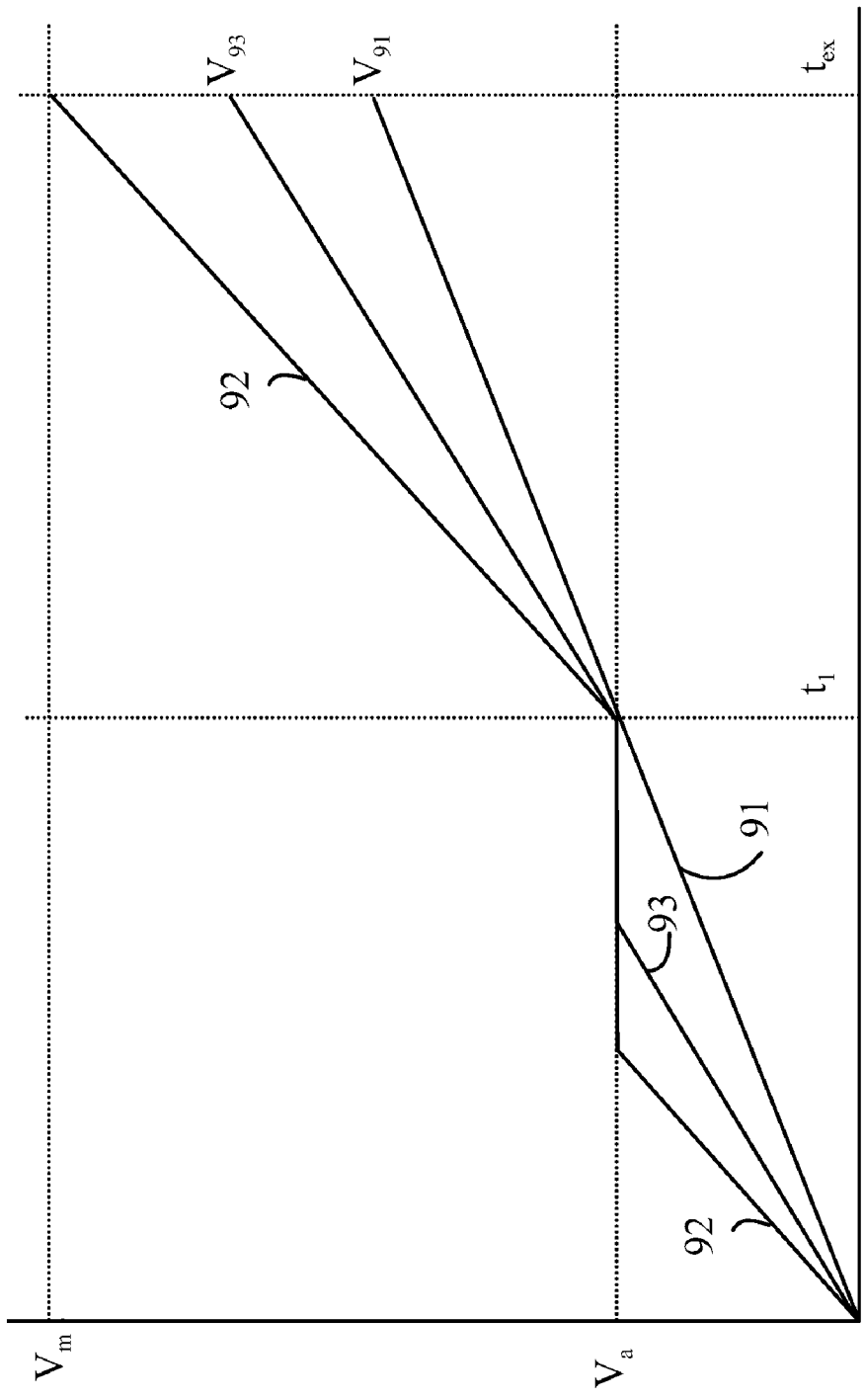

IMAGING ARRAY WITH NON-LINEAR LIGHT RESPONSE

BACKGROUND OF THE INVENTION

The present invention may be more easily understood in the context of imaging arrays such as those used in digital photography to record an image. For the purposes of this discussion, an image will be defined as a two-dimensional array of digital values that represent the amount of light received during an exposure period at each pixel on a two-dimensional surface. It will be assumed that each pixel is a small rectangular area on that surface. In digital photography, the image is recorded by an imaging array in which each pixel includes a photodetector that measures the amount of light that falls on some portion of the pixel area. The smallest light exposure that can be measured is determined by the noise level in the pixels.

There is also a limit on the highest level of light that can be measured by a pixel or the imaging array as a whole. The high-level exposure limit can result from a number of factors. One of the high exposure limits results from the saturation of the storage capability of the photodiodes. The pixels store charge during the exposure period in the photodiodes. This charge is then readout via a readout circuit in the pixels to an analog-to-digital converter (ADC) that converts a signal related to the charge to a digital value. There is a limit on the amount of charge that can be stored in the photodiodes. In addition, the readout circuitry also has a limit on the maximum charge signal that can be converted to an analog signal before the readout circuit saturates. While some of these limitations can be overcome by utilizing more expensive imaging arrays, there is a limit on the maximum signal that can be accommodated. In addition, the increased cost of extending the high exposure limit presents problems to low cost imaging systems such as those used in inexpensive handheld devices such as cellular telephones and PDAs. For the purposes of this discussion, the dynamic range of an imaging array will be defined to be the ratio of the maximum signal for a pixel to the minimum signal that is above the noise.

An image that is to be captured by a camera can also be characterized by a dynamic range. In general, an image has a range of light intensities with a maximum intensity and a minimum intensity. In general, there is a minimum difference in light intensity between two pixels that needs to be distinguished in the final image. If the image is to capture the low light levels and the highest light levels with this precision, the required dynamic range for the image is the maximum image intensity divided by the minimum difference in pixel intensities.

The image dynamic range can be much greater than that of the camera for many applications. Consider an image having an intensity variation of 1000 to 1 within the image, i.e., an image dynamic range of 1000. If the camera uses an imaging array that has a dynamic range of 256 the corresponding 256 intensity levels will not cover the 1000 image intensity values without losing the image detail. If the available bits are used to capture the brightest information, then all of the pixel values below some level will be replaced by 0, and hence, the intensity information will be lost. Similarly if all of the available bits are used to capture the low light pixel information, all of the pixels above some level will be replaced by 255, and hence, those portions of the image will appear "washed out"

One solution to this mismatch problem involves using an imaging array in which the relationship between the output signal from each pixel and the light level during the exposure is non-linear. For example, photodetectors that generate a signal that is proportional to the logarithm of the light intensity have been proposed for applications in which the range of intensities is larger than the range that can be accommodated in simple photodiodes. If the ADC in a camera utilizing pixels based on such photodiodes has sufficient bits to capture the data, then the dynamic range of the camera could, in principle, be increased to a level that could accommodate higher dynamic range images.

Unfortunately, such an approach would substantially increase the cost of the camera and reduce the fill factor in each of the pixels. The additional circuitry needed to provide the logarithmic output in each pixel is significantly larger than the readout circuitry in conventional camera pixels. Hence, the area occupied by each pixel in the imaging array would be substantially larger, and the fraction of the pixel area that actually measures the light would decrease substantially. The cost of the imaging array increases with the area of silicon needed to construct the array, and hence, this added area leads to an increase in the cost of the imaging array.

The fill factor is the ratio of the photosensitive area of the pixel to the total area of the pixel. When the pixel fill factor is reduced, the camera sensitivity is decreased, which will reduce the camera dynamic range under low light conditions. Further, the charge holding capacity of the photodiode decreases with the fill factor, which reduces the camera dynamic range at high light conditions.

In addition, logarithmic pixel values cannot be directly displayed as an image in a manner that is desirable for a casual camera user on a low cost camera. The logarithmic scale distorts the image at all intensity levels, and hence, does not conform to the image seen by the camera user in any range of intensities.

SUMMARY OF THE INVENTION

The present invention is an imaging array and method for capturing an image utilizing the same. The imaging array includes an array of pixel sensors and a controller. Each pixel in the array of pixel sensors includes a dual-ported photodiode characterized by first and second gates, and a charge conversion circuit. The charge conversion circuit generates a voltage signal that is a function of a charge on the dual-ported photodiode when the first gate in the dual-ported photodiode is activated to transfer charge on the dual-ported photodiode to the charge conversion circuit. The controller applies a potential to the second gates in the dual-ported photodiodes, each second port passing charge stored in the photodiode connected to the second port when a potential in the photodiode exceeds the applied potential. During an exposure of the array to an image, the first gates in the pixel sensors are held at a first port gate potential, and the controller varies the potential on the second gates such that charge flows through the second gates of pixel sensors that are exposed to light intensities greater than a first threshold intensity during the exposure. The potential on the second gate is less than the first gate potential for part of the exposure.

In one aspect of the invention, the controller increases the potential on the second gates in two steps during the exposure, at least one of the steps being a potential less than the first port gate potential. In one aspect of the invention, the steps are chosen such that the voltage signals from pixel sensors that are exposed to light less than a second threshold intensity are not reduced relative to the voltage signals that would have been generated by those pixels if the potentials on the second ports was set at a value greater than or equal to the first port gate potential during the exposure.

In yet another aspect of the invention, the controller corrects measurements of the voltage signals for the charge that flowed through the second gates during the exposure for one voltage signal from one of the pixel sensors. The controller, optionally, displays an image generated from the corrected measurements.

In a further aspect of the invention, the second ports of the dual-ported photodiodes in a sub-set of the pixel sensors are connected to an overflow bus, and the controller measures a current flowing in the overflow bus. In one aspect of the invention, the sub-set of the pixels includes pixels in a predetermined region of the imaging array and not pixels in other regions. In another aspect of the invention, the controller varies a potential on the second gates in the dual-ported photodiodes in the imaging array in response to the measured current.

BRIEF DESCRIPTION OF THE DRAWINGS

FIG. 3 is a schematic drawing of an embodiment of a pixel that is utilized in one embodiment of an imaging array according to the present invention.

FIGS. 4A and 4B illustrate the potential distribution as seen by a photoelectron in a photodiode.

FIG. 7 is a plot of the potential in the photodiode as a function of time during the exposure.

FIG. 8 is a plot of the potential on the second port gates as a function of time during the exposure.

DETAILED DESCRIPTION OF THE PREFERRED EMBODIMENTS OF THE INVENTION

Figure 1:
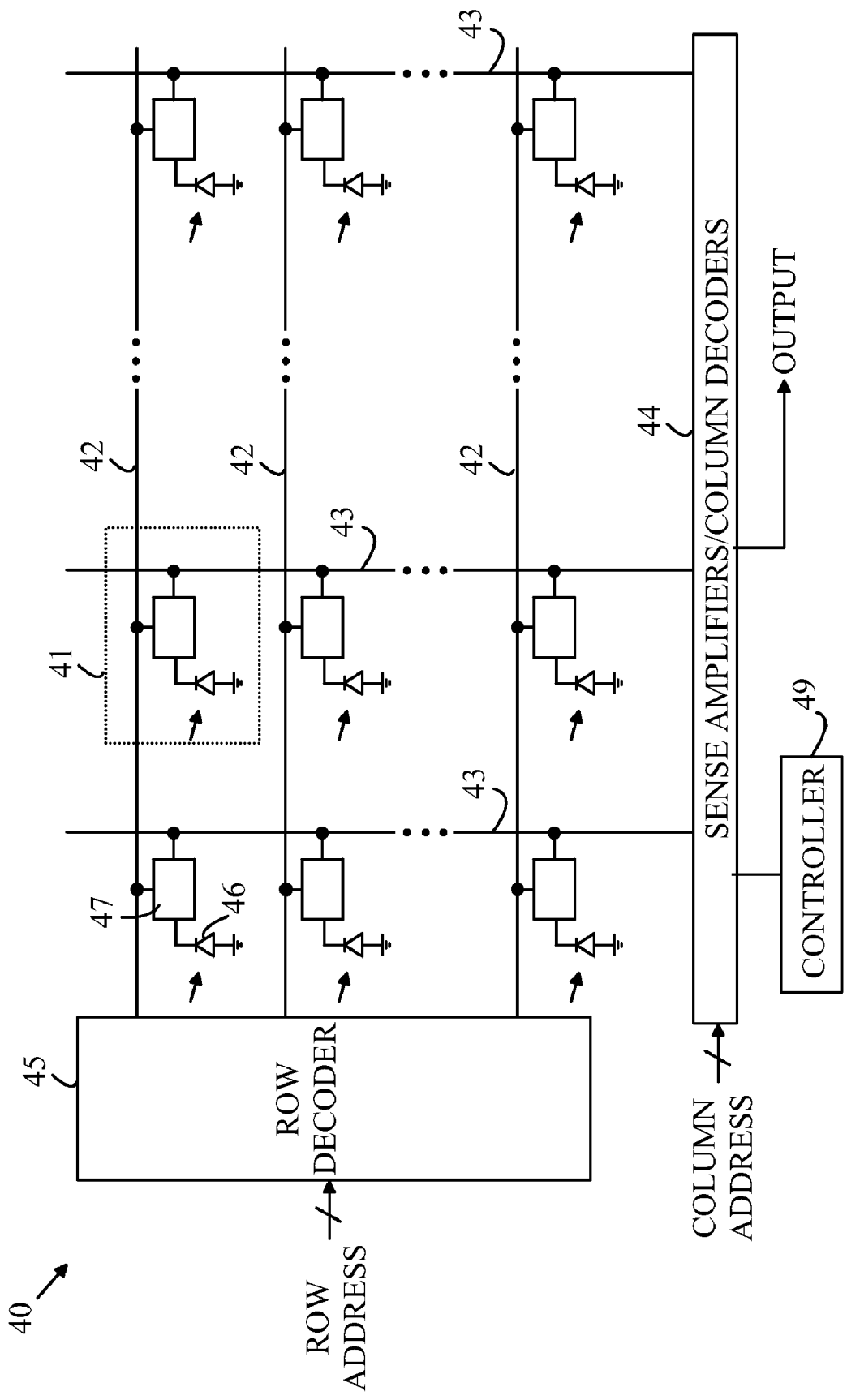
FIG. 1 is a schematic drawing of a prior art CMOS imaging array.

The manner in which the present invention provides its advantages can be more easily understood with reference to FIG. 1, which is a schematic drawing of a prior art CMOS imaging array. Imaging array 40 is constructed from a rectangular array of pixels 41. Each pixel includes a photodiode 46 and an interface circuit 47. The details of the interface circuit depend on the particular pixel design. However, all of the pixels include a gate that is connected to a row line 42 that is used to connect that pixel to a bit line 43. The specific row that is enabled at any time is determined by a row address that is input to a row decoder 45. The row select lines are a parallel array of conductors that run horizontally in the metal layers over the substrate in which the photodiodes and interface circuitry are constructed.

The various bit lines terminate in a column processing circuit 44 that typically includes sense amplifiers and column decoders. The bit lines are a parallel array of conductors that run vertically in the metal layers over the substrate in which the photodiode and interface circuitry are constructed. Each sense amplifier reads the signal produced by the pixel that is currently connected to the bit line processed by that sense amplifier. The sense amplifiers may generate a digital output signal by utilizing an ADC. At any given time, a single pixel is readout from the imaging array. The specific column that is readout is determined by a column address that is utilized by a column decoder to connect the sense amplifier/ADC output from that column to circuitry that is external to the imaging array. The various timing operations and address generation is carried out by a controller 49.

To provide low noise, all of the electrons must be removed from the photodiodes when the photodiodes are reset at the beginning of an exposure. To reduce dark current and to ensure complete reset, pinned photodiodes are utilized. In a pinned photodiode, the charge generated by the photons is stored in a potential well that is at a lower potential than the region in which the charge is generated. The storage region is adjacent to a gate transistor. When the gate transistor is placed in a conductive state, all of the charge moves out of the gate onto a node that is held at a potential that assures that all of the charge will leave the photodiode, and hence, the photodiode can be reset. A photogate-type photodetector that operates in accumulation mode is an alternative photodetector type that also has low dark current.

Figure 2:
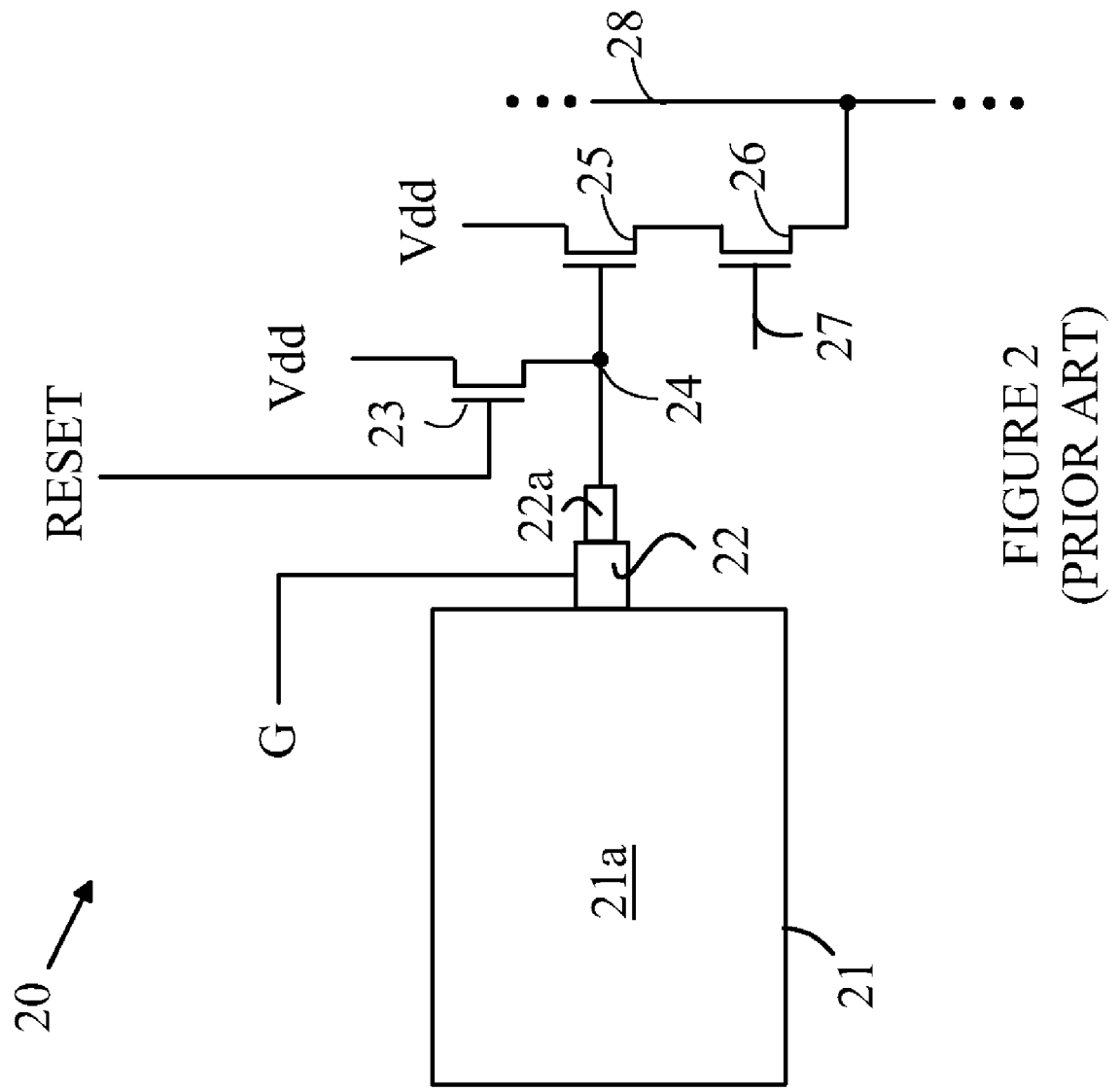
FIG. 2 is a schematic drawing of a prior art pixel that is commonly used in CMOS imaging arrays.

Refer now to FIG. 2, which is a schematic drawing of a prior art pixel that is commonly used in CMOS imaging arrays. Pixel 20 includes four transistors and is often referred to as a 4-transistor pixel cell. Photodiode 21 occupies most of the area of the pixel. Photodiode 21 includes an implant region 21a and a gate 22 that couples the implant region to node 24. Implant region 21a is doped such that the potential of implant region 21a is raised above that of region 22a by enough to allow any charge accumulated in implant region 21a to flow to drain region 22a when gate 22 is placed in the conducting state. Photodiode 21 is reset prior to the image exposure by placing gates 22 and 23 in the conductive state, such that the cathode of photodiode 21 is connected to $V_{dd}$. After the reset operation, gates 22 and 23 are placed in the non-conductive state. During the image exposure, a charge that is related to the light exposure is stored adjacent to gate 22 in photodiode 21. Gate 22 is held at a potential that is sufficient to block that charge from leaving implant area 21a. During readout, charge from photodiode 21 is gated onto node 24 by gate 22 and converted to a voltage by transistor 25. When pixel 20 is selected by a signal on row line 27, transistor 26 applies this voltage to bit line 28.

Refer now to FIG. 3, which is a schematic drawing of an embodiment of a pixel that is utilized in one embodiment of an imaging array according to the present invention. Pixel 50 includes a photodiode 51 having an implant area 51a that is doped to provide a potential that is above the potential of region 52a when gate 52 is at a potential that allows current to flow from implant area 51a to region 52a. Photodiode 51 is also connected to a second drain region 53a by gate 53 that is held at a potential $V_o$ that may be varied during the operation of pixel 50 by second port controller 56. Drain region 53a is connected to a bus 55 that is maintained at a potential that allows any current leaving photodiode 51 through gate 53 to flow to second port controller 56. The remaining elements of pixel 50 function in a manner analogous to that described above with reference to pixel 20, and hence, have been given the same numeric designations and will not be discussed further here.

Refer now to FIGS. 4A and 4B, which illustrate the potential distribution as seen by a photoelectron in photodiode 51 and the gates connecting photodiode 51 to the other circuitry in pixel 50. FIG. 4A illustrates the potential profile during the accumulation of charge during an image exposure. At the start of the exposure the potential in region 51a is as shown at 257. The gates on each side of region 51a are set to provide potential barriers $V_{G1}$ and $V_o$. It will be assumed that $V_o$ is less than $V_{G1}$ for reasons that will be discussed in more detail below. As photoelectrons are accumulated in region 51a, the potential increases as shown at 58.

Refer now to FIG. 4B. Assume that pixel 20 is readout prior to the potential in region 51a reaching $V_o$. Pixel 20 is readout by lowering the potential barrier at gate 52 to a value below potential 257, which is initially at a potential of $V_{24}$. As a result, any charge stored in region 51a will flow to node 24 and be stored on parasitic capacitor 57. Capacitor 57 converts the charge to a voltage that is proportional to the amount of charge that was transferred. It is assumed that the maximum potential on capacitor 57 is less than the potential shown at 257, and hence, the entire contents of the photodiode are emptied at readout.

Figure 5:
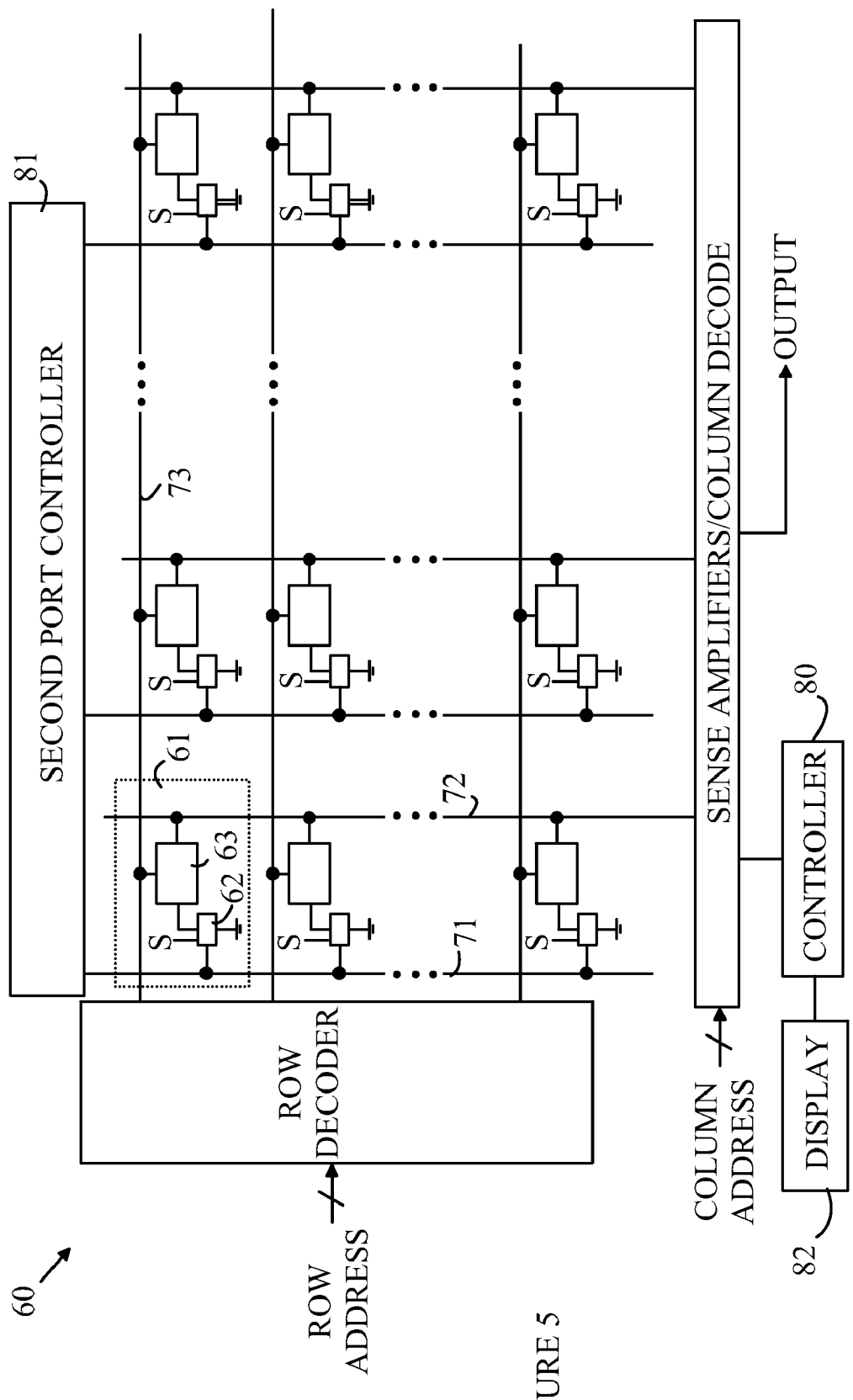
FIG. 5 illustrates one embodiment of an imaging array according to the present invention.

To simplify the following discussion, a pinned photodiode having two independent gates for emptying charge from that photodiode will be referred to as a "dual-ported" photodiode in the following discussion. Refer now to FIG. 5, which illustrates one embodiment of an imaging array according to the present invention. When used in a camera or the like, an image is projected onto imaging array 60 such that each pixel samples the light intensity at a different point in the image. To simplify the drawings, the optics and other features of the camera have been omitted.

Imaging array 60 is constructed from pixels having dual-ported photodiodes. A typical pixel is labeled at 61. Pixel 61 includes a dual-ported photodiode 62 having one port connected to a conventional readout circuit 63 that operates in a manner analogous to that described above with reference to interface circuit 47 shown in FIG. 1. That is, the contents of dual-ported photodiode 62 are readout on bit line 72 when a row select signal is provided on row line 73. Dual-ported photodiode 62 is also reset by circuitry in readout circuit 63 in a manner analogous to that described above with reference to interface circuit 47 shown in FIG. 1. To simplify the drawings, the reset and gate control lines for the first port have been omitted from the drawing. However, it is to be understood that these lines connect each pixel to controller 80, which manages the various readout and reset functions.

The second port is connected to bus 71. A signal denoted by S in FIG. 5 determines the potential, $V_o$, on the gate associated with the second ports. By altering S, the charge level at which charge leaks out of each photodiode onto bus 71 can be controlled. Refer again to FIG. 4A. If the potential in region 51a exceeds $V_o$ during the accumulation of charge in the image exposure phase, the excess current will leak out of region 51a to drain 53a and be coupled to second port controller 56 by bus 55 as shown in FIG. 3. Bus 55 is maintained at a potential below $V_o$ and preferably below potential 257. Referring again to FIG. 5, the level S is set by controller 80 through second port controller 81; however, to simplify the drawing, these signal connections have been omitted from the drawing. The buses, such as bus 71, that connect the second ports of the dual-ported photodiode to second port controller 81 will be referred to as the overflow buses in the following discussion.

The manner in which the invention provides its advantages can be more easily understood by first considering the problem of saturation in a conventional pixel. In a conventional pixel, there is a maximum potential $V_m$ within the photodiode that can be represented by a linear pixel value. Typically, once the internal potential in the photodiode reaches $V_m$, one of two problems typically occurs resulting in the signal from the pixel reaching a plateau at a saturation value. In the first case, any additional photoelectrons that the pixel attempts to accumulate leak out of the photodiode and are lost because the potential in region 51a exceeds the potential on either gate 53 or gate 52. The leaked charge could be collected by the adjacent pixels; therefore the value of those pixels could saturate resulting in a phenomenon called blooming. In the second case, the photodiode has sufficient capacity to store all of the charge; however, the source follower saturates if the number of electrons transferred to the source follower parasitic capacitance exceeds a limit. To simplify the following discussion, it will be assumed that the former problem is encountered first.

Figure 6:
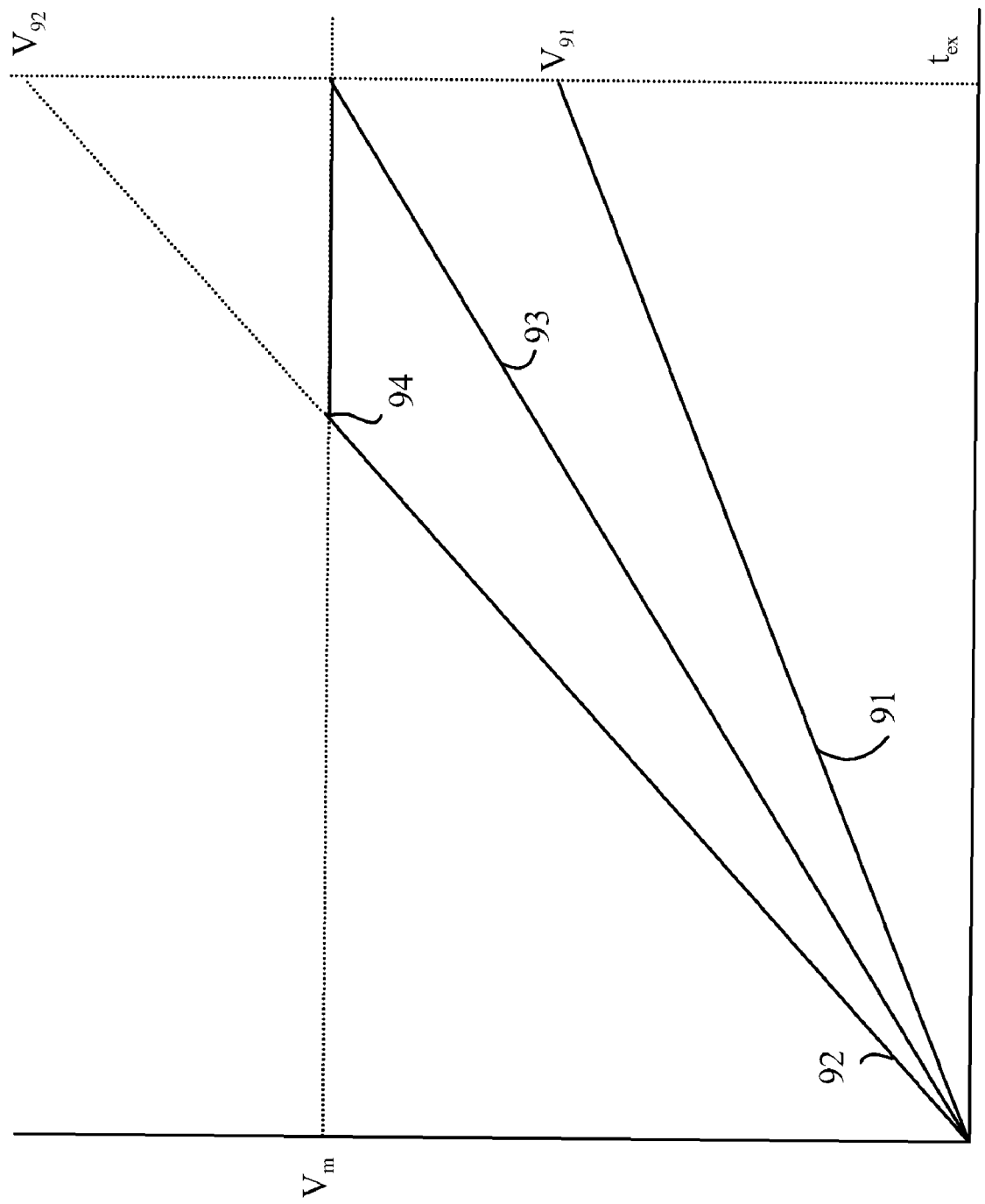
FIG. 6 illustrates the potential in the photodiode when the photodiode is exposed to light of three different intensity values during an exposure of length $t_{ex}$.

Refer now to FIG. 6, which illustrates the potential in the photodiode when the photodiode is exposed to light of three different intensity values during an exposure of length $t_{ex}$. The potentials as a function of time within the photodiode corresponding to the three light intensities are shown at 91-93, respectively. The initial slope of each curve is proportional to the light intensity associated with that curve. Curve 93 corresponds to the maximum light exposure that can be accommodated without saturating the photodiode. At time $t_{ex}$, the potential in the photodiode just reaches $V_m$. This light intensity value will be referred to as the maximum linear light intensity. For any light intensity below the maximum linear light intensity, the potential at the end of the exposure will be linearly related to the light intensity. Such a curve is shown at 91. In the absence of noise, $V_{91}$ will be proportional to the intensity of the light received by the pixel. If the light intensity is greater than the maximum light intensity as shown at 92, the potential within the photodiode will reach $V_m$ at a time 94 that is before the end of the exposure, and the remaining electrons will be lost by leakage through one of the gates on the photodiode. As a result, the intensity in such a pixel will be $V_m$ at the end of the exposure rather than the value $V_{92}$ that would have been attained if the photodiode had not saturated.

The manner in which this aspect of the present invention provides its advantages can be more easily understood with reference to a simple example. In the example shown in FIG. 6, all pixels receiving light intensities greater than the intensity represented by curve 93 saturate. By varying the potential on the second port gates during the image exposure, an intensity representation scheme can be implemented in which the pixel signal is linearly related to the light intensity for all intensities below that shown at curve 91. In addition, intensities up to that represented by a maximum value that is significantly greater than that corresponding to curve 93 can be measured without saturating and will have potentials between $V_{91}$ and $V_m$ at the end of the exposure period.

Refer now to FIGS. 7 and 8, which illustrate the potentials on the second port gates and in a photodiode during an exposure at the light levels shown in FIG. 6. FIG. 7 is a plot of the potential in the photodiode as a function of time during the exposure, and FIG. 8 is a plot of the potential on the second port gates as a function of time during the exposure. The exposure time is divided into two intervals. Referring to FIG. 8, at the beginning of the exposure, the potential on the second port gates is set at $V_a$. At the end of the first interval, the potential is raised to $V_m$ and remains at this value to the end of the exposure at time $t_{ex}$. $V_a$ and $t_1$ are chosen such that the potential in a pixel receiving a light intensity at or below that shown by curve 91 never exceeds the potential on the second port gate, and hence, such pixels will end the exposure with a potential in the photodiode that is proportional to the light intensity received by that pixel.

Refer now to FIG. 7. For pixels receiving light intensities greater than that represented by curve 91, the potential in the pixel will saturate during the first time interval, since the potential will reach $V_a$, and any new charge will leak out of the photodiode through the second port gate. The time at which the pixel potential saturates will depend on the light intensity received by that pixel. Pixels receiving higher light intensities will saturate before pixels receiving lower light intensities. Hence, curve 92 saturates before curve 93.

At the end of the first time period, the potential on the second port gates is increased to $V_m$. Hence, any pixels that were in saturation at $V_a$ are now free to accumulate additional charge. The potential on these pixels then increases at a rate determined by the light intensity. Hence, at the end of the exposure, the potentials on these pixels will differ by an amount that depends on the light intensity. That is, the pixels will not saturate for light intensities between those represented by curves 92 and 93. Hence, the dynamic range of the pixel array has been extended.

Figure 10:
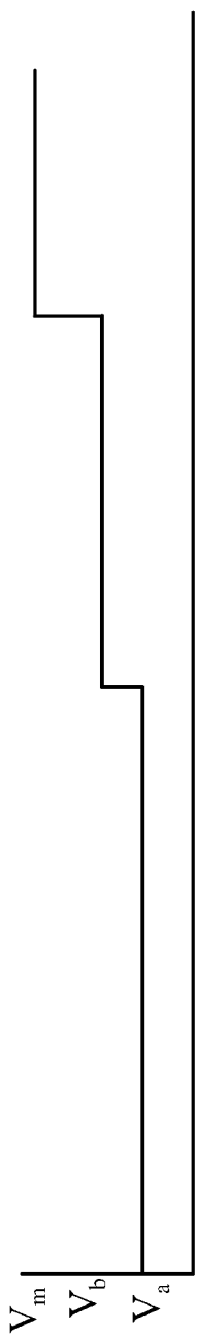
FIG. 10 is a plot of the potential on the second port gates as a function of time during the exposure.
Figure 9:
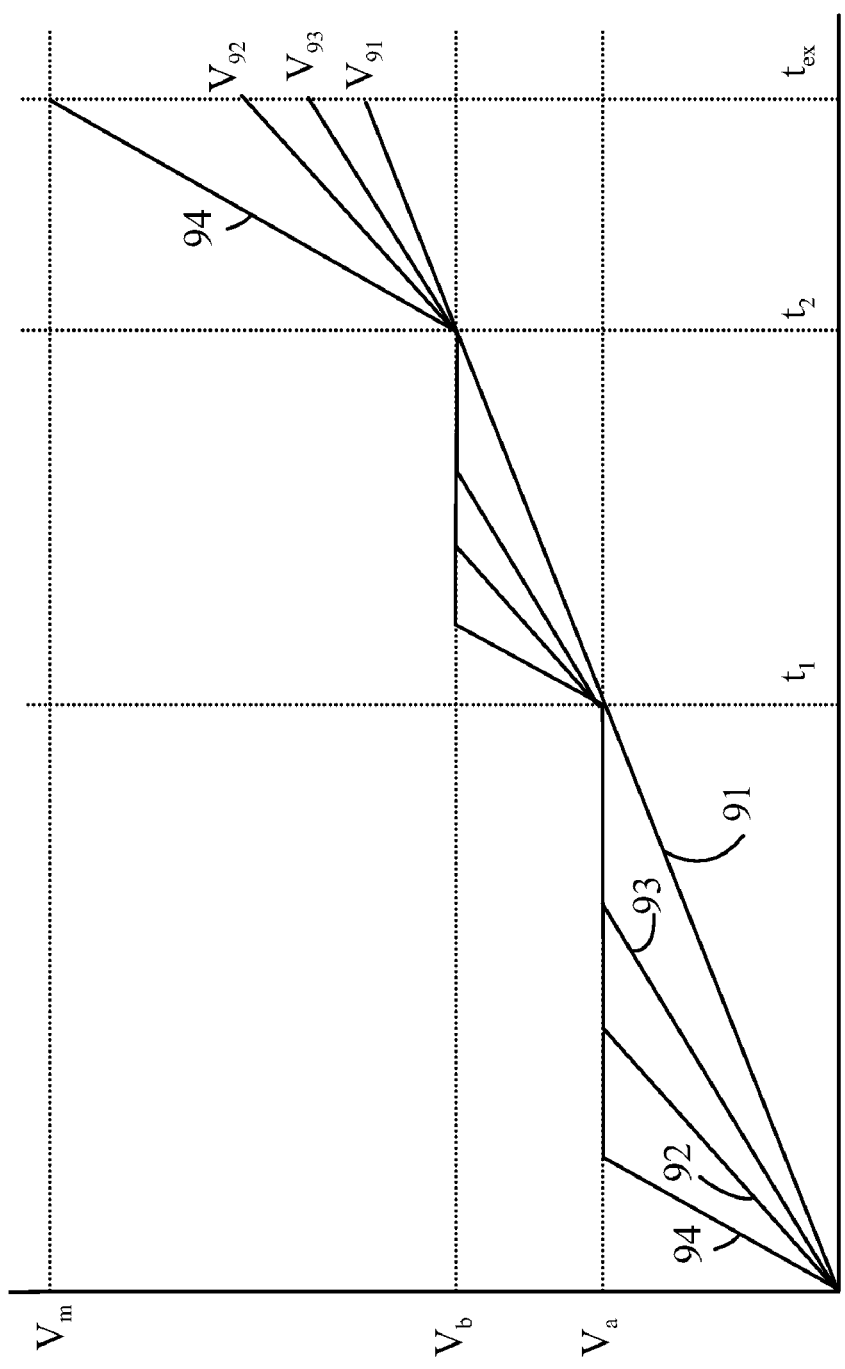
FIG. 9 is a plot of the potential in the photodiode as a function of time during the exposure.

In the exemplary embodiment discussed with respect to FIGS. 7 and 8, the potential on the second port gates is stepped only once during the exposure. However, embodiments in which the second port gate potential is stepped additional times to provide a greater dynamic range can also be constructed. Refer now to FIGS. 9 and 10, which illustrate the potentials on the second port gates and in a photodiode during an exposure at the light levels shown in FIG. 6 when the potential on the second port gates is stepped twice. FIG. 9 is a plot of the potential in the photodiode as a function of time during the exposure, and FIG. 10 is a plot of the potential on the second port gates as a function of time during the exposure.

In this embodiment, the exposure time is divided into three time intervals. Referring to FIG. 10, at the beginning of the exposure, the potential on the second port gates is set at $V_a$. At the end of the first interval, the potential on the second port gates is raised to $V_b$ and remains at this value until time $t_2$. At the end of the second time interval, the potential on the second port gates is raised to $V_m$ and remains at that value to the end of the exposure at time $t_{ex}$. $V_b$ and $t_2$ are chosen such that the potential in a pixel receiving a light intensity at or below that shown by curve 91 never exceeds the potential on the second port gate, and hence, such pixels will end the exposure with a potential in the photodiode that is proportional to the light intensity received by that pixel.

Refer now to FIG. 9. For pixels receiving light intensities greater than that represented by curve 91, the potentials will saturate during the first time interval in a manner analogous to that discussed above. At the end of the first time interval, the potential on the second port gates is increased, and hence, the pixels that were saturated at the end of the first time period will be able to accumulate additional charge. The potential in these pixels will saturate again during the second time interval, since the potential will reach $V_b$, and any new charge generated in the photodiode of these pixels will leak out of the photodiode through the second port gate. The time at which the pixel potential saturates will again depend on the light intensity received by that pixel. Pixels receiving higher light intensities will saturate before pixels receiving lower light intensities. Hence, curve 92 again saturates before curve 93 in the second time interval.

At the end of the second time period, the potential on the second port gates is increased to $V_m$. Hence, any pixels that were in saturation at $V_b$ are now free to accumulate more charge. The potential on these pixels then increases at a rate determined by the light intensity. Hence, at the end of the exposure, the potentials on these pixels will differ by an amount that depends on the light intensity. That is, the final signals from the pixels will not saturate for light intensities between those represented by curves 92 and 93. In addition, it should be noted that the final signal, $V_{92}$, from the pixel receiving the highest light intensity is now substantially below $V_m$; hence, the dynamic range of the pixel array has been further extended. In this embodiment, the pixels receiving light levels above that represented by curve 92 up to the pixels receiving light levels represented by curve 94 will also generate final values below $V_m$, and hence, will not saturate. The final potential corresponding to curve 93 is shown at $V_{93}$. Embodiments that utilize even more steps can also be constructed to further extend the dynamic range.

To clarify the following discussion, the signal received by the column processing circuitry from each pixel on the column processed by that circuitry will be referred to as the pixel signal value. The pixel signal value corresponding to any given pixel is related to the light intensity, I, received by that pixel by a function of the form $$P(I)=G(I)$$

where $G(I)$ is a monotonically increasing function of I for $I<I_{max}$. For I less than some intermediate intensity level, $I_1$, $G(I)$ is a linear function of I. Accordingly, the inverse function $G^{-1}(P(I))$ can be computed from the pixel signals observed for known light intensities that are less than $I_{max}$ and stored in the controller in the imaging array or camera utilizing the image array. Hence, the actual image intensities can, in principle, be computed by the controller in the camera or imaging array from the observed pixel signals for each pixel and this inverse function. These intensity values can then be displayed as a conventional image that has an expanded dynamic range relative to the dynamic range that would be obtained without the method of the present invention.

While $G(I)$ is always monotonically increasing with I, the signal-to-noise ratio (SNR) of the pixel value $P(I)$ is not. It can be shown that the SNR of a pixel whose light intensity is higher than $I_1$ might be lower than that of a pixel whose light intensity is $I_1$.

Alternatively, the pixel values $P(I)$ themselves can be digitized and displayed as an image on a display within the camera such as display 82 shown in FIG. 5. In regions of the image in which the relationship between $P(I)$ and $G(I)$ is linear, the image will appear normal. In regions in which $I>I_1$, the intensities will be muted compared to the actual intensities; however, such an image is preferable to an image that is washed out at the higher intensities or distorted by an intensity relationship that does not have a linear region.

In the above-described embodiments, the stepping of the potential on the second port gates is predetermined at the time the exposure begins. However, embodiments in which the second port potential is stepped in response to the image being recorded can also be constructed. Refer again to FIG. 5. In imaging array 60, the overflow buses such as 71 collect the charge that leaks out of the second port gates and routes that charge to second port controller 81. The amount of charge that is detected on any given overflow bus is related to the pixels that have saturated and the light intensity being received by those pixels.

In the arrangement shown in FIG. 5, there is one overflow bus per column of pixels; however, the second port gates on a particular two-dimensional sub-array of pixels could likewise be connected to a separate overflow bus, and hence, the magnitude of the saturation occurring within that sub-set could be measured. One sub-set of interest in many camera designs is the set of pixels near the center of the imaging array, since the camera user tends to center the region of interest in the image within the frame of the camera. Accordingly, in this mode of operation, the potential on the second port gates in the pixel sensors is altered during the exposure to minimize the saturation of these pixels while extending the dynamic range of the pixels.

Figure 11:
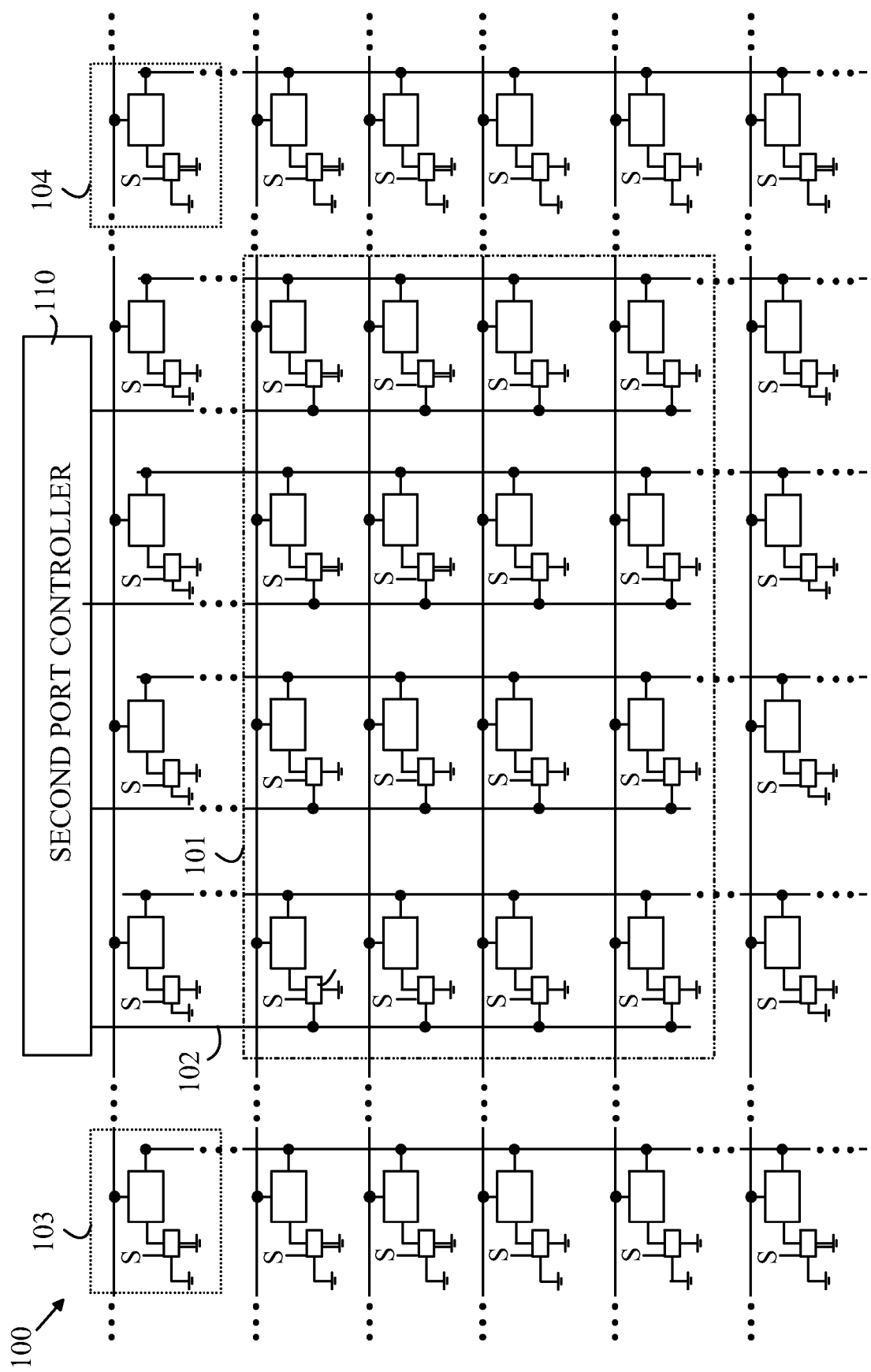
FIG. 11 illustrates a portion of an imaging array according to another aspect of the present invention.

Refer now to FIG. 11, which illustrates a portion of an imaging array according to another aspect of the present invention. Imaging array 100 differs from imaging array 60 discussed above in that the pixel sensors in the central region 101 of the imaging array have drain regions connected to overflow buses such as bus 102. The overflow buses are monitored by second port controller 110, which also controls the potential on the gates of all of the second ports. The drain regions of the second ports in the pixel sensors outside the central regions such as pixel sensors 103 and 104 are connected to $V_{dd}$ or another suitable potential to guarantee that any charge that leaks out of the photodiodes through these ports is removed.

In this embodiment the potential on the second port gates is increased stepwise during the exposure in a manner analogous to that discussed above; however, the time at which a step in potential occurs is determined by the current flowing in an overflow bus that connects the second port gates in these pixels to second port controller 110. The potential on the second port gates is increased to maintain these pixels in the mode in which the pixel signals are proportional to the light intensity. If controller 110 detects an excessive overflow current on the relevant bus, the potential on the second port gates is increased. In one aspect of the invention, the exposure is terminated if the potential on the second port gates has been increased to the maximum and a significant amount of overflow is observed before the end of the exposure.

The embodiments discussed above utilize double-ported photodiodes having a conventional gate for resetting and transferring charge from the photodiode during readout and an auxiliary gate (i.e., the second port) for providing a controlled overflow route that can be utilized to alter the light response function of the photodiode. As noted above, in some applications, measuring the overflow current on a sub-set of the pixels in the pixel array allows the controller to control the response function of those pixels thereby providing advantages in certain types of photographic applications. In cameras having a number of preset photographic applications such as portraits, landscapes, etc., the particular sub-set of pixels that are to be controlled can vary with the application. In such a camera, a particular pixel can be a member of more than one sub-set. Hence, it would be advantageous to provide a pixel design that allows a pixel to be part of more than one sub-set.

Figure 12:
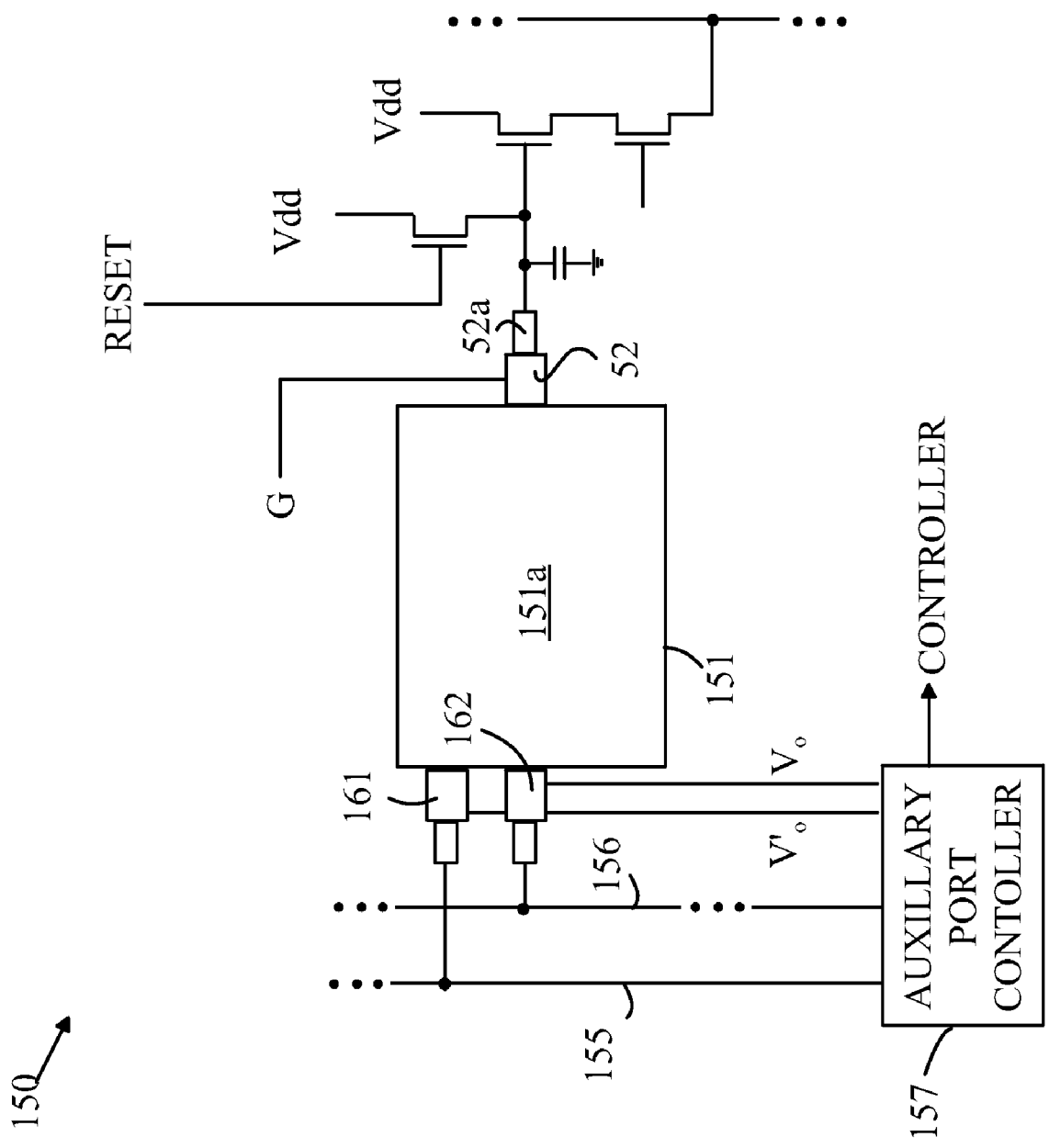
FIG. 12 illustrates the three-ported photodiode according to another embodiment of the present invention.

Refer now to FIG. 12, which illustrates the three-ported photodiode according to another embodiment of the present invention. Pixel 150 includes a three-ported photodiode 151 having a light conversion and charge accumulation area 151a. During the resetting and readout of photodiode 151, gate 52 is used in a manner analogous to that discussed above. Photodiode 151 also has two auxiliary ports that are controlled by gates 161 and 162 and that are connected to overflow buses 155 and 156, respectively. The potentials on gates 161 and 162 are controlled separately via auxiliary port controller 157. When pixel 150 is being operated as part of a first subset of pixels, gate 162 is set to a potential at or above that of gate 52, and the potential on gate 161 is varied over the exposure. In this configuration, the current on bus 155 is measured to control the potential profile on gate 161. When pixel 150 is being operated as part of a second subset of pixels, gate 161 is set to a potential at or above that of gate 52, and the potential on gate 162 is varied over the exposure. In this configuration, the current on bus 156 is measured to control the potential profile on gate 162. The auxiliary gates in the pixels that are not part of the subset in question during the exposure are set to the same potential as the auxiliary gates corresponding to the subset that is being utilized. That is, when the potential is being varied on gate 162, the auxiliary gates in all other pixels in the imaging array are set to the same potential as gate 162. If any of those pixels have additional auxiliary gates, those additional gates are inactivated by setting the potential on those additional gates to a potential above that on gate 52.

In another aspect of this embodiment, the controller in the imaging array keeps track of the potential profile applied to the second port gates. The gain curve as a function of light intensity is then computed by the controller from the recorded potential profile and calibration data on the array.

In the above-described embodiments, the potential on the second port gates is increased in a stepwise fashion. However, embodiments in which the potential is increased in a non-stepwise manner could also be constructed. For example, the potential could be increased linearly at a rate that ensures that the pixels receiving the maximum light levels that are to be linearly related to the light intensity do not overflow.

The above-described embodiments of the present invention utilize a separate second port controller. However, embodiments in which the second port controller is included in the array controller can also be constructed.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. An apparatus comprising:
    an array of pixel sensors, each pixel sensor comprising a dual-ported photodiode or photogate characterized by ports having first and second gates, and a charge conversion circuit, said charge conversion circuit generating a voltage signal that is a function of a charge on said dual-ported photodiode when said first gate in said dual-ported photodiode is activated to transfer a charge on said dual-ported photodiode to said charge conversion circuit; and
    a controller that applies a potential to said second gates in said dual-ported photodiodes, each second port passing charge stored in said photodiode connected to said second port when a potential in said photodiode exceeds said applied potential,
    wherein, during an exposure of said array to an image, said first gates in said pixel sensors are held at a first port gate potential and wherein said controller varies said potential on said second gates during said exposure, said potential on said second gate being less than said first gate potential for part of said exposure.

2. The apparatus of claim 1, wherein said controller increases said potential on said second gates in two steps during said exposure, at least one of said steps being a potential less than said first port gate potential.

3. The apparatus of claim 2 wherein said steps are chosen such that said voltage signals from said pixel sensors that are exposed to light less than a second threshold intensity are not reduced relative to said voltage signals that would have been generated by those pixels if said potentials on said second ports was set at a value greater than or equal to said first port gate potential during said exposure.

4. The apparatus of claim 1 wherein said controller corrects measurements of said voltage signals for said charge that flowed through said second gates during said exposure for one voltage signal from one of said pixel sensors.

5. The apparatus of claim 4 wherein said controller displays an image generated from said corrected measurements.

6. The apparatus of claim 1 wherein said second ports of said dual-ported photodiodes in a sub-set of said pixel sensors are connected to an overflow bus and said controller measures a current flowing in said overflow bus.

7. The apparatus of claim 6 wherein said sub-set of said pixels comprises pixels in a predetermined region of said imaging array and not pixels in other regions.

8. The apparatus of claim 6 wherein said controller varies a potential on said second gates in said dual-ported photodiodes in said imaging array in response to said measured current.

9. The apparatus of claim 1 wherein one of said dual-ported photodiodes comprises a third port having a third gate and said controller controls a potential on said third gate.

10. The apparatus of claim 9 wherein said second port of said dual-ported photodiode is connected to a first overflow bus and said third port of said dual-ported photodiode is connected to a second overflow bus and said controller measures a current flowing in said first overflow bus or said second overflow bus.

11. A method for recording an image, said method comprising:
projecting said image on an array of pixel sensors for an exposure time, each pixel sensor comprising a dual-ported photodiode or photogate characterized by first and second gates that are connected to first and second gate potentials, respectively;
maintaining said first gate potential at a first potential during said exposure time;
varying said second gate potential during said exposure time such that charge flows through said second gates of pixel sensors that are exposed to light intensities greater than a first threshold intensity during said exposure, but does not flow through said second gates of pixel sensors that are exposed to light intensities less than said first threshold intensity, said exposure time being chosen such that charge in at least one of said pixel sensors does not flow through said second gate of that pixel sensor during said exposure; and
measuring a charge stored in each pixel sensor after said exposure time has elapsed.

12. The method of claim 11, wherein said second port potential increases in two steps during said exposure, at least one of said steps being a potential less than said first gate potential.

13. The method of claim 11 further comprising correcting said charge measurements for charge that flowed through said second gates during said exposure.

14. The method of claim 13 further comprising displaying an image generated from said corrected charge measurements.

15. The method of claim 11 further comprising measuring a current flowing from said second ports of a predetermined sub-set of said pixel sensors during said exposure.

16. The method of claim 15 wherein said sub-set of said pixels comprises pixels in a predetermined region of said imaging array and not pixels in other regions.

17. The method of claim 15 wherein said second gate potential is varied in response to said measured current.

* * * * *